United States Patent
Tsai et al.

(10) Patent No.: US 9,779,998 B2
(45) Date of Patent: Oct. 3, 2017

(54) SEMICONDUCTOR DEVICE AND METHOD OF MANUFACTURING THE SAME

(71) Applicant: UNITED MICROELECTRONICS CORP., Hsin-Chu (TW)

(72) Inventors: Chia-Chen Tsai, Tainan (TW); Hung-Chang Chang, Taichung (TW); Ta-Kang Lo, Taoyuan (TW); Tsai-Fu Chen, Hsinchu (TW); Shang-Jr Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/450,037

(22) Filed: Mar. 6, 2017

(65) Prior Publication Data
US 2017/0221766 A1 Aug. 3, 2017

Related U.S. Application Data

(62) Division of application No. 15/057,079, filed on Feb. 29, 2016.

(30) Foreign Application Priority Data

Feb. 3, 2016 (TW) .............................. 105103612 A

(51) Int. Cl.
| | | |
|---|---|---|
| H01L 21/82 | (2006.01) | |
| H01L 21/8234 | (2006.01) | |
| H01L 21/8238 | (2006.01) | |
| H01L 27/092 | (2006.01) | |
| H01L 29/78 | (2006.01) | |

(52) U.S. Cl.
CPC ............. *H01L 21/823468* (2013.01); *H01L 21/823418* (2013.01); *H01L 21/823814* (2013.01); *H01L 21/823864* (2013.01); *H01L 27/092* (2013.01); *H01L 29/7848* (2013.01)

(58) Field of Classification Search
CPC ......... H01L 27/0886; H01L 21/823437; H01L 21/31144; H01L 29/66636; H01L 29/165; H01L 29/7848
See application file for complete search history.

(56) References Cited

U.S. PATENT DOCUMENTS

| | | |
|---|---|---|
| 6,165,826 A | 12/2000 | Chau |
| 7,442,967 B2 | 10/2008 | Ko |
| 7,452,764 B2 | 11/2008 | Hoffmann |
| 7,618,856 B2 | 11/2009 | Ting |
| 7,732,285 B2 | 6/2010 | Sell |
| 7,927,954 B2 | 4/2011 | Ting |
| 8,278,166 B2 | 10/2012 | Chen |
| RE45,462 E | 4/2015 | Mori |
| 2004/0259343 A1 | 12/2004 | Buller |

(Continued)

*Primary Examiner* — Evren Seven
*Assistant Examiner* — S. M. S Imtiaz
(74) *Attorney, Agent, or Firm* — Winston Hsu

(57) ABSTRACT

A method of manufacturing a semiconductor device is provided in the present invention. Multiple spacer layers are used in the invention to form spacers with different predetermined thickness on different active regions or devices, thus the spacing between the strained silicon structure and the gate structure (SiGe-to-Gate) can be properly controlled and adjusted to achieve better and more uniform performance for various devices and circuit layouts.

3 Claims, 5 Drawing Sheets

(56) References Cited

U.S. PATENT DOCUMENTS

| | | |
|---|---|---|
| 2007/0228417 A1 | 10/2007 | Yasutake |
| 2010/0193882 A1 | 8/2010 | Hoentschel |
| 2012/0058609 A1* | 3/2012 | Lee ................. H01L 21/823807 |
| | | 438/199 |
| 2013/0285143 A1 | 10/2013 | Oh |
| 2015/0187941 A1 | 7/2015 | Zhou |
| 2016/0020109 A1* | 1/2016 | Yoo .................... H01L 21/3085 |
| | | 438/275 |

* cited by examiner

SEMICONDUCTOR DEVICE AND METHOD OF MANUFACTURING THE SAME

CROSS REFERENCE TO RELATED APPLICATIONS

This application is a divisional application of and claims the benefit of U.S. patent application Ser. No. 15/057,079, filed Feb. 29, 2016.

BACKGROUND OF THE INVENTION

1. Field of the Invention

The present invention relates generally to a method of manufacturing a semiconductor device, and more particularly, to a method of manufacturing a semiconductor device with different spacer thickness. The thickness of the spacer is adjusted according to the desired spacing between the strained silicon structure and the gate structure.

2. Description of the Prior Art

Recent advances in semiconductor technology as applied to integrated circuits include the use of "strain engineering" (or, alternatively, "stress engineering") in the manufacture of semiconductor device structures. It has been discovered that the tuning of strain in the crystal lattice of metal-oxide-semiconductor (MOS) transistor channel regions can enhance carrier mobility in those regions. As is fundamental in MOS device technology, the source/drain current (i.e., drive) of an MOS transistor in both the triode and saturation regions is proportional to carrier mobility in the channel region. In a general sense, compressive stress enhances hole mobility in the channel region of a p-channel MOS transistor, and tensile stress enhances electron mobility in the channel region of an n-channel MOS transistor. Typically, p-channel MOS transistors exhibit lower drive capability than n-channel MOS transistors in typical modern integrated circuits. As such, strain engineering techniques are more typically applied to p-channel MOS transistors than to n-channel MOS transistors in current day manufacturing technology.

Various strain engineering approaches are known in the art. According to the approach known as "embedded SiGe" (also referred to as "eSiGe"), the source and drain regions of a p-channel MOS transistor structure are etched from the silicon substrate or well region, and are replaced with a silicon-germanium alloy formed by selective epitaxy. Because of the germanium atoms within the crystal lattice, the germanium constituting as much as 25% to 30% (atomic) of the alloy, eSiGe exhibits a larger lattice constant than does silicon (i.e., the distance between unit cells in the crystal lattice for SiGe is greater than in single-crystal silicon). Embedded eSiGe source/drain regions thus apply compressive stress to the channel region of the p-channel MOS transistor being formed. This compressive stress in the channel increases the hole mobility of the p-channel MOS transistor, and enhances its performance.

A similar approach for improving carrier mobility is known for n-channel MOS transistors. Commonly assigned U.S. Pat. No. 7,023,018, incorporated herein by reference, describes the use of silicon-carbon alloy material as source/drain structures in n-channel MOS transistors. As described in that U.S. patent, silicon-carbon source/drain structures cause an increase in tensile stress in a direction parallel to the intended direction of source/drain current flow in the transistor. This tensile stress in the source/drain regions increases tensile strain in the p-type channel region between the source and drain structures, which increases electron mobility in that channel region and thus improves the performance of the n-channel MOS transistor.

It has been observed, however, that the physical shape of the strained eSiGe can be quite non-uniform within an integrated circuit due to loading effects from neighboring geometries. This issue is mainly resulted from the varied width and poly/feature spacing of devices in different pattern density or layout. The non-uniform shapes of strained eSiGe would affect device's performance since the eSiGe overfill and the resulting strain force exerts on the lattice in the channel would vary from the different devices.

One could avoid this undesired effect in several conventional ways. One approach would be to design the gate structures with a relatively constant width and spacing across the integrated circuit; however, this constraint would significantly reduce the ability of the designer to optimize the layout for device and circuit performance. Another approach would be to incorporate sacrificial "dummy" structures, such that the loading effects would be absorbed by non-functional structures. Of course, that approach consumes valuable chip area. It would be necessary for those ordinarily skilled in the art to find a better solution.

SUMMARY OF THE INVENTION

In order to solve the problem of non-uniform shapes of strained silicon structures caused by the loading effect in integrated circuits, the concept of devices with different spacer thicknesses is provided in the present invention. The thickness of the spacer may be adjusted depending on the types or requirement of the devices to control the spacing of strained silicon to gate, thereby achieving the purpose of uniform performance for all devices under different pattern densities or circuit layouts.

One purpose of the present invention is to provide a novel semiconductor device. The semiconductor device includes multiple gate structures on a substrate with spacers on two sidewalls. The spacer of the gate structure on the first region consists of a first spacer layer and the spacer of the gate structure on the second region consists of the first spacer layer and other different spacer layers. Strained silicon structures are formed on the substrate outside each spacer. The spacings between strained silicon structure and the gate structure on the first region and the second region are different.

The other purpose of the present invention is to provide a method of manufacturing a semiconductor device. The method includes the steps of providing a substrate having a first region and a second region, forming gate structures on the substrate, forming a conformal first spacer layer on gate structures, forming a first mask covering the second region, performing a first etch process to shape the first spacer layer on the first region into first spacers on each gate structure on the first region, forming a conformal second spacer layer cover the substrate, forming a second mask covering the second region, removing the second spacer layer on the first region, forming a third mask covering the first region, and performing a second etch process to shape the first spacer layer and the second spacer layer on the second region into second spacers on each gate structure on the second region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
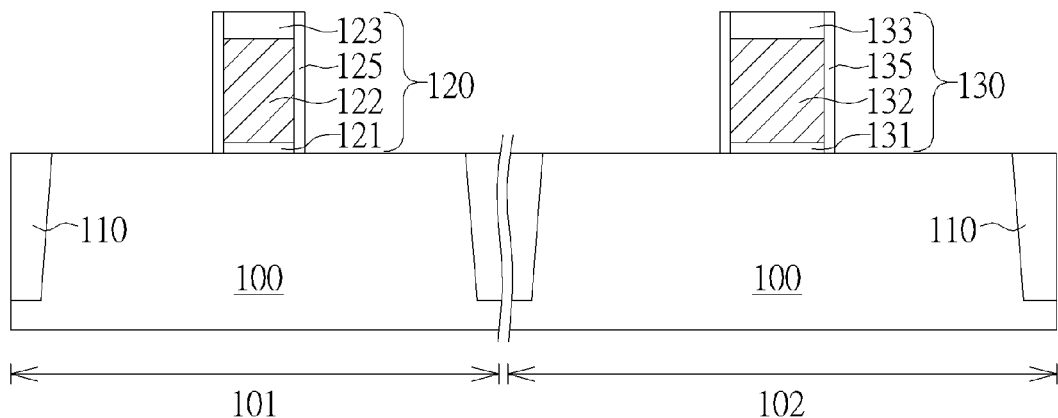
FIG. 1 is a schematic illustration of forming a gate structure on a first region and a second region of a substrate in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method of manufacturing a semiconductor device according to an embodiment of the present invention will be described with reference to FIGS. 1 to 8. Although a process of planar type semiconductor device is provided as an exemplary embodiment of the present invention, please note that it is not intended to limit the scope and spirit of the present invention only to this scheme. The concept and principle may also be applied and implemented in the manufacture of 3D type semiconductor devices, such as fin type field effect transistor (FinFET) or multi-gates transistor.

Please refer to FIG. 1, first, a substrate 100 is provided, for example a semiconductor substrate like silicon substrate, a silicon containing substrate a III/V GaN-on-silicon substrate, a grapheme-on-silicon substrate or a silicon-on-insulator (SOI) substrate, to serve as a base for forming the semiconductor devices. In the embodiment of the present invention, the substrate 100 includes a first region 101 and a second region 102. The first region 101 and the second region 102 may be two regions with different pattern densities or for different semiconductor devices to be manufactured thereon, such as a PMOS (P-type metal-oxide semiconductor) region and a NMOS (N-type metal-oxide semiconductor) region defined by the well type doped in the substrate 100. The regions are separated by a shallow trench isolation (STI) 110. In implementation, the substrate will be provided with two or more regions with more different characteristics for various devices. The feature differences of the regions will be exemplarily described in the following embodiment with only two different regions.

In the embodiment of the present invention, different gate structures 120 and 130 are formed respectively on the two regions 101 and 102 of the substrate 100, such as two PMOS gates with different thicknesses. Alternatively, in another embodiment, the gate structure 120/130 may be a NMOS gate and a PMOS gate respectively. Both of gate structures 120 and 130 include a gate dielectric 121/131, a gate electrode 122/132 on the gate dielectric, a cap layer 123/133 on top of the gate structure. The gate dielectric 121/131 may be made of silicon oxide, silicon oxycarbonitride, high-k material or the combination thereof, with a thickness depending on various devices. The gate electrodes 122/132 may be made of doped or undoped mono-crystalline silicon or poly-crystalline silicon, SiGe material, metal silicide, or conductive metal. The cap layer 123/133 may be made of dielectric, such as silicon nitride or silicon oxide. Optionally, additional liners 124/134, e.g. an oxide layer, may be formed on sidewalls of the gate structure 120/130 to provide protection or buffer for the gate structure. The gate structures 120/130 may have same or different widths. In the embodiment, for example, the width of the gate structure 130 (e.g. a PMOS) is depicted wider than the width of the gate structure 120 in FIG. 1 in order to provide an exemplary implementation for the description about the relation between the thickness of spacers and the width of the gate structures in the following embodiment. For simplicity and preventing obscuring the subject of the present invention, the lightly-doped drains (LDD) and corresponding process will be omitted in the disclosure hereinafter.

Figure 2:
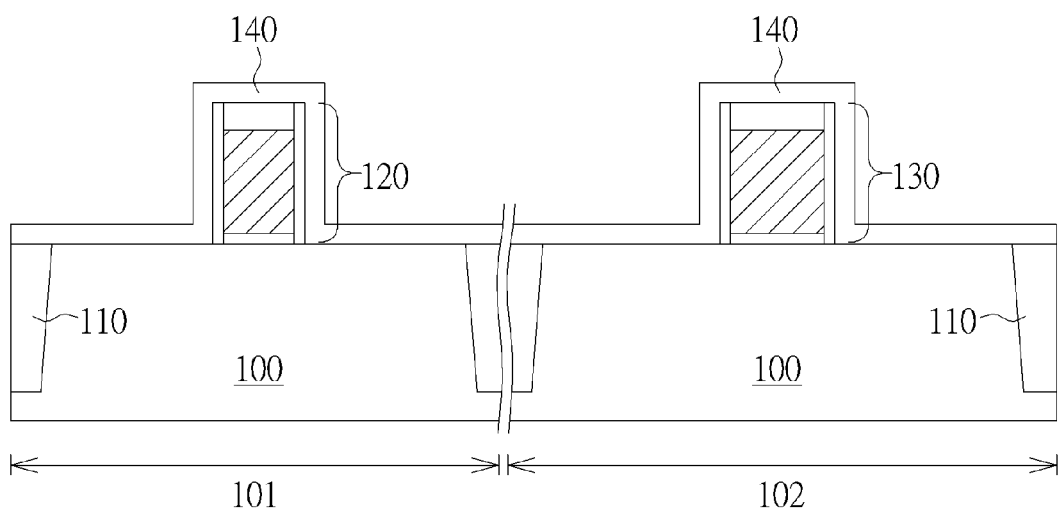
FIG. 2 is a schematic illustration of forming a conformal first spacer layer on the gate structure and the substrate in accordance with one embodiment of the present invention.

Next, please refer to FIG. 2, a first spacer layer 140 is conformally formed on the substrate 100 and the gate structures 120 and 130. The first spacer layer 140 may be formed by using conventional material and process, which include but are not limited to silicon oxide, silicon nitride, silicon carbonitride and/or silicon oxycarbonitride by chemical vapor deposition (CVD) or atomic layer deposition (ALD). In another embodiment, the first spacer layer 140 may be a multilayer structure made of the materials listed above. The thickness of the first spacer layer 140 may be determined based on the design requirement of the MOS device to be formed. For example, the thickness of the first spacer layer 140 may determine the spacing between the gate structure and the strained silicon structure, which is referred hereinafter as the spacing of strained-Si-to-gate. The spacing of strained-Si-to-gate may further influence the shape of the strained-Si structure and the straining efficiency exerted on the channel lattice. Different devices or layouts have different feature sizes or circumstances, such as poly spacing, gate width, pattern density, threshold voltage (Vts), and even the geometry of adjacent patterns. Adjusting the spacing of strained-Si-to-gate may efficiently achieve more uniform electrical performances for various devices. The key point of the present invention is to form spacers with different thicknesses on different regions or devices by using a plurality of spacer layers, thereby adjusting and controlling the desired spacing of strained-Si-to-gate and achieve uniform performance for various devices and circuit layouts.

Figure 3:
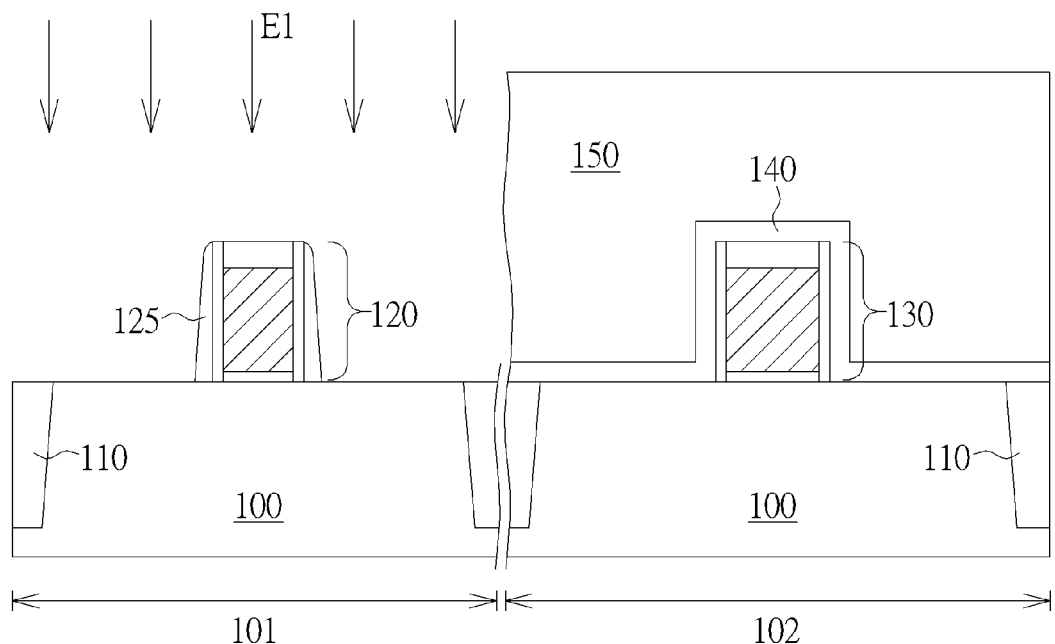
FIG. 3 is a schematic illustration of forming a first mask on the second region of the substrate and performing an etch process to form a first spacer on the first region of the substrate in accordance with one embodiment of the present invention.

In the following embodiment, the steps of how to form the spacers with different thicknesses on different regions of the substrate by using multiple spacer layers will be explicitly described. Please refer to FIG. 3, a lithography process is performed to form a first mask 150, e.g. a photoresist (PR) coating, on the second region 102 of the substrate 100. A first etch process E1 is then performed, such as an anisotropic dry etch process directed to the material of the spacer, until the cap layer 123 of the gate structure and the substrate 100 are exposed, such that the first spacer layer 140 on the first region 101 which is not covered by the first mask 150 is shaped into a first spacer 125 on sidewalls of the gate structures 120 on the first region, while the first spacer layer 140 on the second region 102 remains intact due to the protection of the first mask 150. As it is shown in FIG. 3, the bottom thickness of the first spacer 125 formed on the first region 101 approximately equals to the thickness of original first spacer layer 140. This thickness would determine the spacing of strained-Si-to-gate of the semiconductor device on the first region 101.

Figure 4A:
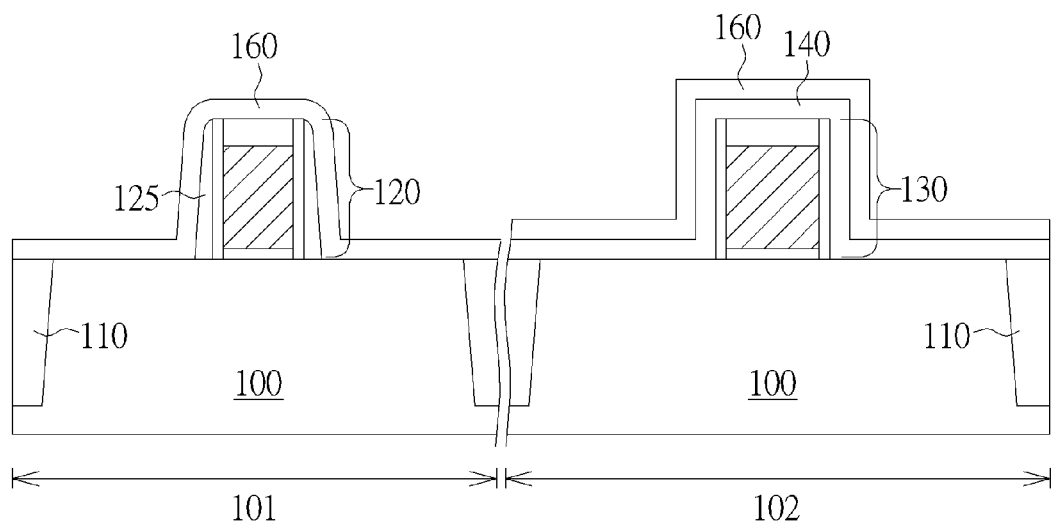
FIG. 4A is a schematic illustration of forming a conformal second spacer layer after the first spacer is formed in accordance with one embodiment of the present invention.

Please refer to FIG. 4A, after the first spacer 125 is formed, the first mask 150 on the second region is then removed, for example by an PR ashing process, to expose the remained first spacer layer 140. Next, a second spacer layer 160 may be formed on the substrate 100, the gate structure 120 and the exposed first spacer layer 140 with conformal deposition. It is shown in the figure that the first spacer layer 140 and the second spacer layer 160 constitute a multilayer structure on the second region 102. The second spacer layer 140 may be formed by conventional materials, which include but are not limited to silicon oxide, silicon nitride, silicon carbonitride and/or silicon oxycarbonitride by chemical vapor deposition (CVD) or atomic layer deposition (ALD). In the embodiment of the present invention, the material of the second spacer layer 160 is preferably different from the one of the first spacer layer 140 in order to have a better etching selectivity, so that the second spacer layer 160 may be selectively removed by etching method in subsequent processes. Furthermore, the thickness of the second spacer layer 160 may be determined based on the design requirement of the MOS device to be formed. The total bottom thickness of the second spacer layer 160 and the previously formed first spacer layer 140 determines the spacing of strained-Si-to-gate of the semiconductor device on the second region 102.

Figure 4B:
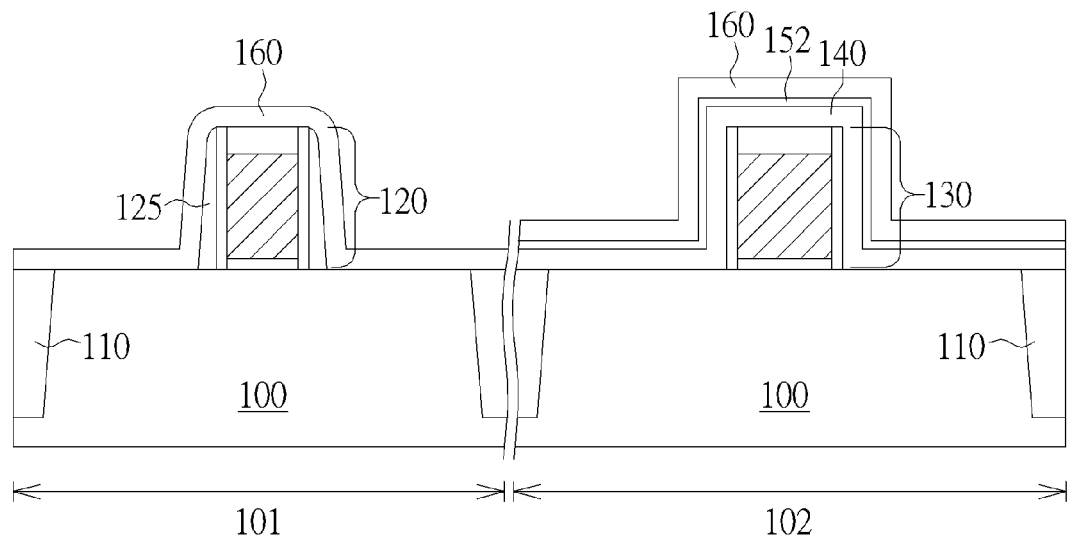
FIG. 4B is a schematic illustration of forming a conformal buffer film and a second spacer layer after the first spacer is formed in accordance with the other embodiment of the present invention.

Alternatively, in another embodiment as shown in FIG. 4B, an additional buffer film 152, e.g. an oxide film, may be formed between the first spacer layer 140 and the second spacer layer 160. In the condition that the first spacer layer 140 and the second spacer layer 160 have the same material, the buffer film 152 may serve as an etch stop layer in subsequent processes for removing the second spacer layer 160. In this way, the second spacer layer 160 may be readily removed without damaging the inner first spacer layer 140, even if the two spacer layers are not provided with relative good etch selectivity.

Figure 5:
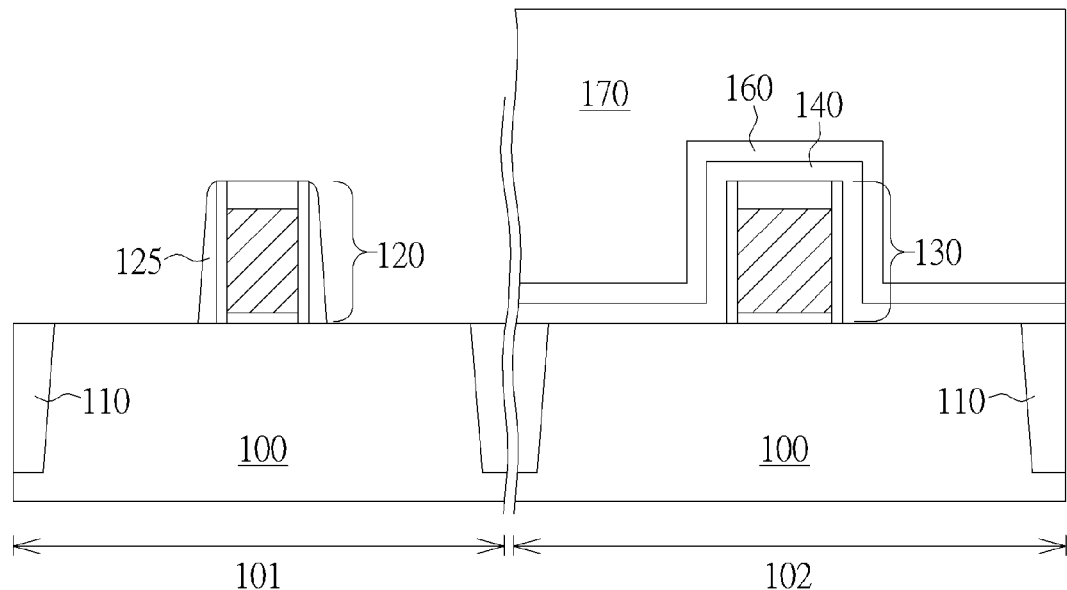
FIG. 5 is a schematic illustration of forming a second mask on the second region of the substrate and removing the first spacer layer on the first region of the substrate in accordance with one embodiment of the present invention.

Please refer to FIG. 5, after the second spacer 160 is formed, a lithography process is performed to form a second mask 170, e.g. a PR coating, on the second region 102 of the substrate 100. The second spacer layer 160 on the first region 101 which is not covered by the second mask 170 is then removed, while the second spacer layer 160 on the second region 102 remains intact due to the protection of the second mask 170. When the materials of the second spacer layer 160 and the first spacer layer 140 are different, the second spacer layer 160 may be removed by using a selective etch process, so that only the second spacer layer 160 will be removed and the underlying first spacer 125 remains intact. Alternatively, if the materials of the second spacer layer 160 and the first spacer 125 are the same, an isotropic etch process may be performed to remove a predetermined thickness of the spacer layer on the first region 101, such that the previously formed first spacer 125 may also remain intact.

Figure 6:
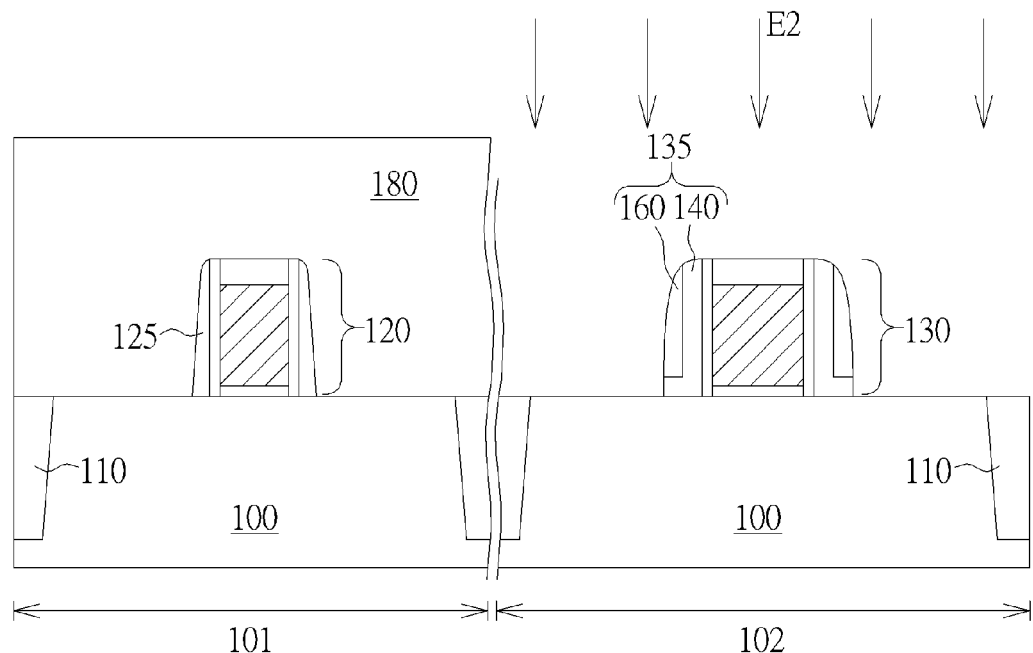
FIG. 6 is a schematic illustration of forming a third mask on the first region of the substrate and performing an etch process to form a second spacer on the second region of the substrate in accordance with one embodiment of the present invention.

Please refer to FIG. 6, after the second spacer layer 160 on the first region is removed, the second mask 170 on the second region is then removed, for example by a PR ashing process, to expose the second spacer layer 160 on the second region 102. Next, a third mask 180 is formed on the first region 101, e.g. a PR coating, to cover the gate structure 120 on the first region 101. A second etch process E2 is then performed, such as an anisotropic dry etch process directed to the material of the spacer, until the cap layer 133 of the gate structure 130 and the substrate 100 are exposed, such that the first spacer layer 140 and the second spacer layer 160 on the second region 102 which is not covered by the third mask 180 are shaped into a second spacer 135 on sidewalls of the gate structures 130 on the second region, while the first spacer 125 on the first region 101 remains intact due to the protection of the third mask 180. As it is shown in FIG. 6, the second spacer 135 formed on the second region 120 is a multilayer structure composed of the first spacer layer 140 and the second spacer layer 160 with a thickness approximately equal to the total bottom thickness of the former first spacer layer 140 and second spacer layer 160. This thickness determines the spacing of strained-Si-to-gate for the semiconductor device on the second region 120. Since inner first spacer layer 140 and outer second spacer layer 160 are shaped into the second spacers 135 in the same etch process, it is shown in the figure that the inner first spacer layer 140 of the second spacer 135 is L-shaped.

In the implementation, the gate structure (e.g. 130) with wider width would need larger threshold voltage (Vts) to drive. Increasing the predetermined spacing of strained-Si-to-gate for wider gate structure may effectively provide the required threshold voltage. In regard to the present invention, as shown in FIGS. 1-6, the approach of forming multilayered spacers on predetermined region of the substrate may form spacers with different thicknesses on sidewalls of their corresponding gate structures with different widths and characteristics, thereby achieving the purpose of controlling and adjusting the spacing of strained-Si-to-gate for various devices. By repeating the process steps of FIGS. 2-6, the multilayered spacer structure may be formed of two or more spacer layers and with larger thickness to meet the circuit requirement.

Figure 7:
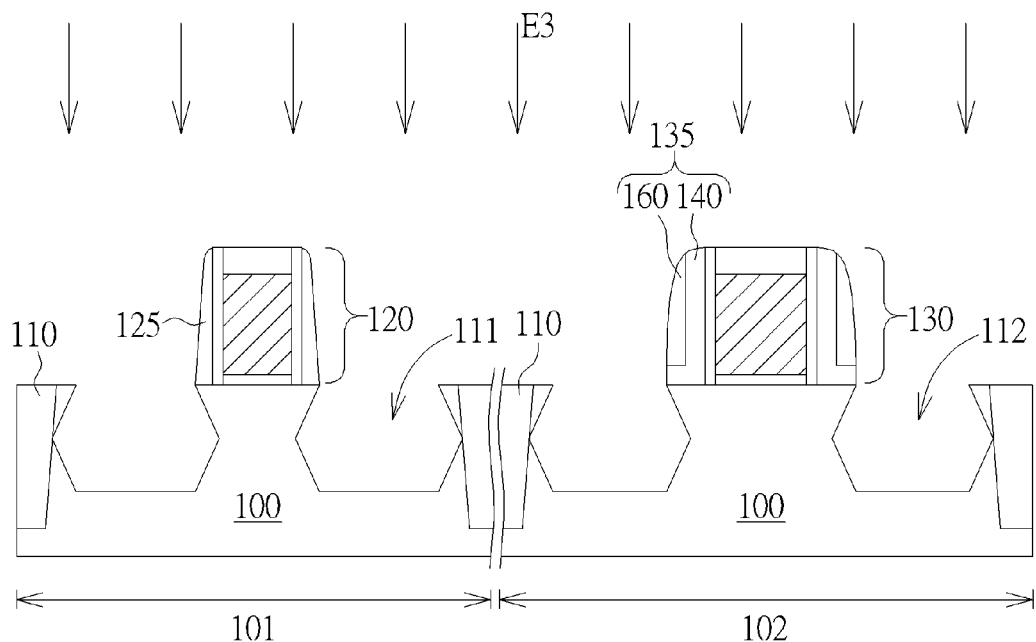
FIG. 7 is a schematic illustration of forming a recess outside of each spacer in accordance with one embodiment of the present invention.

Referring to FIG. 7, after the second spacer 135 is formed, the third mask 180 on the first region 101 is then removed, for example by a PR ashing process, to expose the gate structure 120 and the first spacer 125 on the first region 101. Next, using the gate structures 120 and 130, the first spacer 125 and the second spacer 135 and the shallow trench isolation 110 as a mask to perform a third etch process E3, for example a dry etch, wet etch or both, to form multiple recesses 111 and 112 on the substrate 100 outside each first spacer 125 and each second spacer 135. The recesses 111 and 112 will serve as the space to contain the strained silicon structure to be grown in following process. The Si-based substrate 100 would be etched along the crystalline planes <110> and <111>, thus the resulting recesses 111 and 112 are provided with specific etch feature planes, i.e. the diamond type facets depicted in the figure.

Since the gate structure 120 and 130, the first spacer 125 and the second spacer 135 and the shallow trench isolation 110 are used as a mask in the third etch process E3, it is clearly shown in the figure that the widths of recesses 111 and 112 are determined by the widths of spacers 125 and 135 and the spacings of the gate structures 120, 130 to shallow trench isolation 110.

In the implementation, if the spacing between the gate structures is larger, i.e. in a layout with smaller pattern density, the volume of the strained silicon structure grown in recess 111/112 would become relative larger due to the overfilling effect in the epitaxy process. The overfilled strained silicon structure may cause stack fault issue because the strain applied on channel is too large. In the present invention, the volume of the strained silicon structure may be controlled by the adjusted spacing of strained-Si-to-gate. For example, in the configuration of identical poly spacing, reducing the thickness of spacers may correspondingly increase the width of the recesses 111/112 in later process, such that the issues of overfilling and too large volume of the strained silicon structure can be prevented due to the increased recess capacity.

Figure 8:
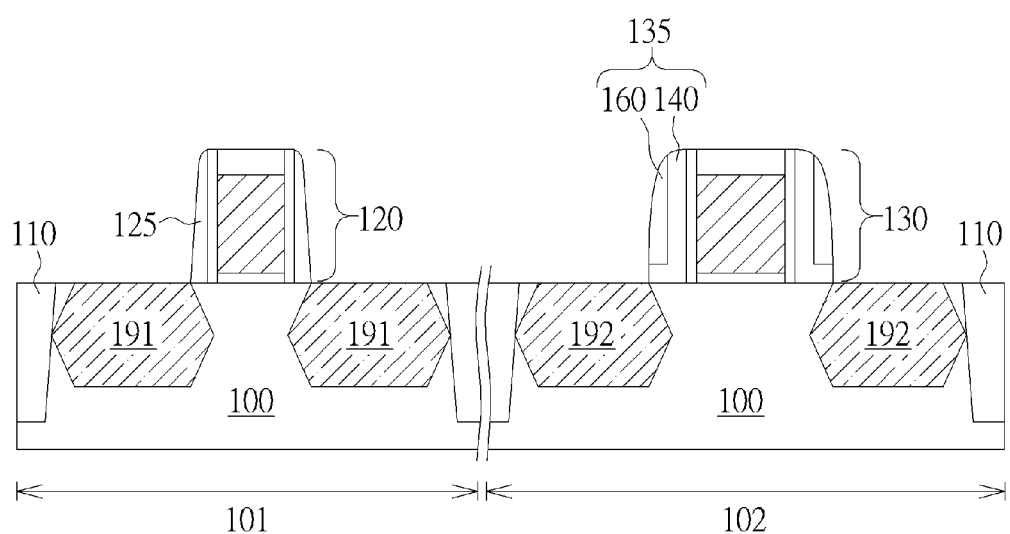
FIG. 8 is a schematic illustration of forming a recess outside of each spacer in accordance with one embodiment of the present invention.

Please refer to FIG. 8, after the recesses 111, 112 are formed, a pre-clean process is performed to remove native oxides or other impurities from the surface of the recesses 111, 112. This step may improve the shape and the cross-sectional structure of the strained silicon structures to be formed therein in later process. An epitaxy process is then performed to form the strained silicon structures. In this stage, since only the surface of the recesses 111, 112 on the substrate 100 are pure Si surface, the strained silicon structures, e.g. SiGe, may only be grown in the recesses 110 and 112 in the epitaxy process. In this preferred embodiment, a selective strain scheme (SSS), such as a selective epitaxial growth (SEG) process may be employed to form the strained silicon structures 191/192, in which the material of the strained silicon structures 191/192 may be selected based on the characteristics of transistor. For example, SiGe may be used to form the strained silicon structures 192 in PMOS regions, while SiC, SiP or SiCP may be used to form strained silicon structures 191 in NMOS regions. As shown in FIG. 8, the strained silicon structures 191/192 fill up the recesses 111/112 and may protrude from the surface of the substrate 100.

In another embodiment, for example, when the gate structures 120 and 130 are respectively a NMOS and a PMOS, the recess 111 on the first region 101 and the recess 112 on the second region 102 may be formed respectively in different etch processes, and the corresponding strained silicon structures 191/192 may also be grown in different epitaxy processes.

Please note that the source/drain of the gate structures 120/130 may be formed before, after or even in-situ in the formation of the strained silicon structures 191/192. For the simplicity and preventing the obscure of the subject of the present invention, relevant process and description is omitted in the disclosure and drawings.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing a substrate having a first region and a second region;
   forming multiple gate structures on said substrate;
   forming a conformal first spacer layer on said multiple gate structures and said substrate;
   forming a first mask covering said second region;
   performing a first etch process to shape said first spacer layer on said first region which is not covered by said first mask into a first spacer on sidewalls of each said gate structure on said first region;
   removing said first mask;
   forming a conformal second spacer layer on said substrate, said multiple gate structures, said first spacers and said first spacer layer;
   forming a second mask covering said second region;
   removing said second spacer layer on said first region which is not covered by said second mask;
   removing said second mask;
   forming a third mask covering said first region;

performing a second etch process to shape said first spacer layer and said second spacer layer on said second region which is not covered by said third mask into second spacers on each said gate structure on said second region; and performing a third etch process to form recesses on said substrate outside said first spacers or said second spacers of each said gate structure after said third mask is removed.

2. The method of manufacturing a semiconductor device of claim 1, further comprising the step of removing said third mask after said second etch process.

3. The method of manufacturing a semiconductor device of claim 1, further comprising the step of performing an epitaxy process to form strained silicon structures in said recesses.

* * * * *